United States Patent [19]

King et al.

[11] Patent Number: 5,761,053
[45] Date of Patent: Jun. 2, 1998

[54] FARADAY CAGE

[75] Inventors: David Robert King, Elkton, Md.;
Joseph C. Rowan, Wilmington, Del.;
Daniel D. Johnson, Yorklyn, Del.;
Bradley E. Reis, Wilmington, Del.

[73] Assignee: W. L. Gore & Associates, Inc., Newark, Del.

[21] Appl. No.: 643,292

[22] Filed: May 8, 1996

[51] Int. Cl.⁶ .................................................. H05K 9/00
[52] U.S. Cl. .................. 361/818; 174/35 R; 174/35 GC; 361/752; 361/753
[58] Field of Search .............. 174/35 R, 35 GC, 174/51; 361/816, 818, 719, 748, 753, 752, 796, 799, 800

[56] References Cited

U.S. PATENT DOCUMENTS

| | | |
|---|---|---|
| 3,885,084 | 5/1975 | Kaiserswerth et al. ............ 174/35 |
| 3,953,566 | 4/1976 | Gore ...................................... 264/288 |
| 4,385,102 | 5/1983 | Fitzky et al. ........................ 429/111 |
| 4,557,957 | 12/1985 | Manniso ............................... 428/36 |
| 4,575,578 | 3/1986 | Bogan et al. .......................... 174/35 |
| 4,857,668 | 8/1989 | Buonanno ............................ 174/35 |
| 4,912,594 | 3/1990 | Bannink, Jr. et al. ............... 361/218 |
| 5,202,536 | 4/1993 | Buonanno ............................ 174/35 |
| 5,269,810 | 12/1993 | Hull et al. ............................ 607/129 |
| 5,297,007 | 3/1994 | Deyo et al. .......................... 361/707 |
| 5,373,102 | 12/1994 | Ehrlich et al. ....................... 174/35 R |
| 5,400,949 | 3/1995 | Hirvonen et al. ................... 174/35 R |
| 5,604,026 | 2/1997 | King ..................................... 428/317.1 |

FOREIGN PATENT DOCUMENTS

| | | |
|---|---|---|
| 0 560 072 | 2/1993 | European Pat. Off. . |
| 0 594 041 | 4/1994 | European Pat. Off. . |
| 3520531 | 11/1986 | Germany ............................. 174/35 R |
| 92/16095 | 9/1992 | WIPO . |
| 96/06520 | 2/1996 | WIPO . |

OTHER PUBLICATIONS

Patent Abstracts of Japan vol. 017, No. 009 (E-1303) 8 Jan. 1993 & JP.A.04 242 010 (Sony Chem Corp) 28, Aug. 1992.

*Primary Examiner*—Kristine L. Kincaid
*Assistant Examiner*—Hung V. Ngo
*Attorney, Agent, or Firm*—Victor M. Genco, Jr.

[57] ABSTRACT

A Faraday cage is provided for EMI/RFI shielding which includes a substrate having an electrical ground; at least one electronic component electrically connected to the substrate; a conductive housing; and an electrically conductive adhesive. The electrically conductive adhesive may be defined by a substrate having numerous passageways through the substrate. The passageways are defined by a plurality of walls of the material making up the substrate. The walls are covered with a layer of conductive metal. The passageways are filled with a non-conductive adhesive resin. The conductive housing is adhesively electrically mounted to the electrical ground of the substrate, over the electronic component, to shield electromagnetic and radio frequency interference.

4 Claims, 1 Drawing Sheet

FARADAY CAGE

BACKGROUND OF THE INVENTION

Electromagnetic interference (EMI) has been defined as undesired conducted or radiated electrical disturbances from an electrical or electronic apparatus, including transients, which can interfere with the operation of other electrical or electronic apparatus. Such disturbances can occur anywhere in the electromagnetic spectrum. Radio frequency interference (RFI) is often used interchangeably with electromagnetic interference, although it is more properly restricted to the radio frequency portion of the electromagnetic spectrum, usually defined as between 24 kilohertz (kHz) and 240 gigahertz (GHz).

A shield is defined as a metallic or otherwise electrically conductive configuration inserted between a source of EMI/RFI and a desired area of protection. Such a shield may be provided to prevent electromagnetic energy from radiating from a source. Additionally, such a shield may prevent external electromagnetic energy from entering the shielded system. As a practical matter, such shields normally take the form of an electrically conductive housing which is electrically grounded. The energy of the EMI/RFI is thereby dissipated harmlessly to ground.

Because EMI/RFI disrupts the operation of electronic components, such as integrated circuit (IC) chips, IC packages, hybrid components, and multi-chip modules, various methods have been used to contain EMI/RFI from electronic components. The most common method is to electrically ground a "can", that will cover the electronic components, to a substrate such as a printed wiring board. As is well known, a can is a shield that may be in the form of a conductive housing, a metallized cover, a small metal box, a perforated conductive case wherein spaces are arranged to minimize radiation over a given frequency band, or any other form of a conductive surface that surrounds electronic components. When the can is mounted on a substrate such that it completely surrounds and encloses the electronic components, it is often referred to as a Faraday Cage.

Presently, there are two predominant methods to form a Faraday cage around electronic components for shielding use. A first method is to solder a can to a ground strip that surrounds electronic components on a printed wiring board (PWB). Although soldering a can provides excellent electrical properties, this method is often labor intensive. Also, a soldered can is difficult to remove if an electronic component needs to be re-worked. A second method is to mechanically secure a can, or other enclosure, with a suitable mechanical fastener, such as a plurality of screws or a clamp, for example. Typically, a conductive gasket material is usually attached to the bottom surface of a can to ensure good electrical contact with the ground strip on the PWB. Mechanically securing a can facilitates the re-work of electronic components, however, mechanical fasteners are bulky and occupy "valuable" space on a PWB.

To date, adhesives have not been realistically considered for the attachment of cans to PWBs. An electrically conductive adhesive does not exist that provides adequate electrical properties without resin flow. As is well known, because electrical components are often located very close to a can, any flow of a conductive adhesive may electrically short an electrical component to the can. This is made more difficult by the manufacturing tolerances of the cans and PWBs, which produce parts that are not perfectly flat. The variation of the parts being attached will produce a variable gap between the can and the PWB. If enough pressure is applied to ensure the conductive adhesive fills the areas where the gap is great, then the conductive adhesive will flow out from locations where the gap is small.

The foregoing illustrates limitations in existing Faraday cage designs. Thus, it is apparent that it would be advantageous to provide an improved Faraday cage directed to overcoming one or more of the limitations set forth above. Accordingly, a suitable alternative is provided including features more fully disclosed hereinafter.

SUMMARY OF THE INVENTION

The present invention advances the art of electromagnetic and radio frequency interference (EMI/RFI) shielding beyond which is known to date. In one aspect of the present invention a Faraday cage is provided for EMI/RFI shielding which comprises a substrate having an electrical ground; at least one electronic component electrically connected to the substrate; a conductive housing; and an electrically conductive adhesive. The electrically conductive adhesive may be defined by a substrate having numerous passageways through the substrate. The passageways are defined by a plurality of walls of the material making up the substrate. The walls are covered with a layer of conductive metal. The passageways are filled with a non-conductive adhesive resin. The conductive housing is adhesively electrically mounted to the electrical ground of the substrate, over the electronic component, to shield electromagnetic and radio frequency interference.

It is a purpose of the present invention to provide a Faraday cage for EMI shielding that is quickly and easily attached, that provides good electrical grounding, that does not promote shorting to components, and that allows for simple rework of electrical components.

BRIEF DESCRIPTION OF THE DRAWING

The foregoing summary, as well as the following detailed description of a preferred embodiment of the present invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings.

DETAILED DESCRIPTION OF THE INVENTION

Figure 1:
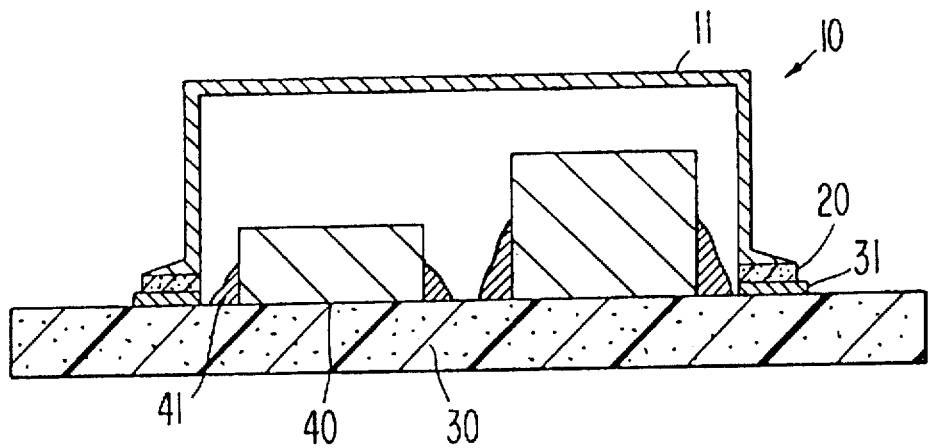
FIG. 1 is a sectional view of the Faraday cage of the present invention shown attached to a PWB with a conductive adhesive, wherein the Faraday cage is providing EMI/RFI shielding.
Figure 2:
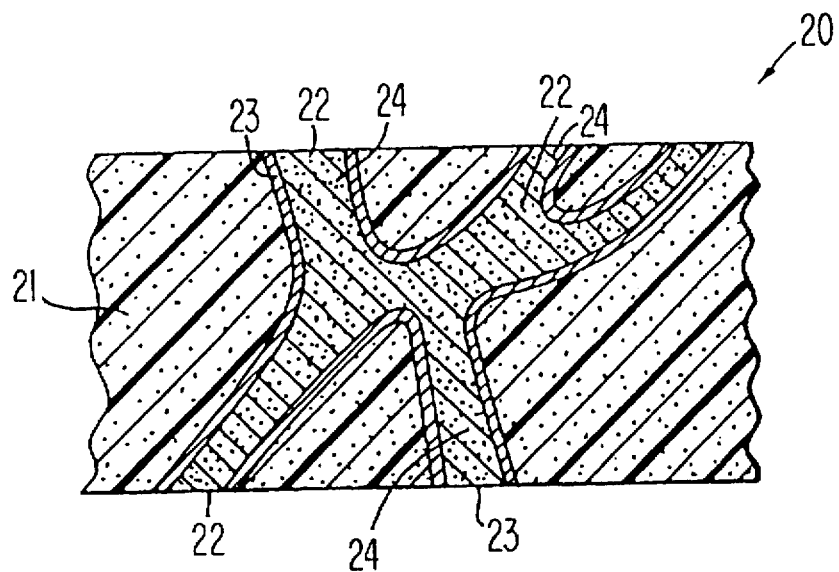
FIG. 2 is an enlarged partial sectional illustration of one embodiment of a suitable conductive adhesive in accordance with the teachings of the present invention.

As best seen by reference to FIG. 1, a Faraday cage, generally illustrated at 10, is provided for EMI/RFI shielding. The Faraday cage 10 comprises a conductive housing 11 that is adhesively electrically mounted to an electrical ground 31 of a substrate 30, over at least one electronic component 40, to shield electromagnetic and radio frequency interference.

The housing 11 may be formed of a thin metal sheet, such as a 0.015 inch thick nickel sheet, for example. Other suitable metals may include, but are not limited to copper, aluminum, or steel, for example. It may also be desirable to surface treat the metal with a chromate conversion coating in the case of aluminum, or a nickel plate in the case of copper or aluminum. The desirable properties of the surface treatment would be enhanced resistance to environmental conditions while maintaining electrical conductivity.

In addition to the use of metal for the housing 11, plastic materials may be formed and metallized in order to provide the desired shape combined with the requisite electrical shielding. Such plastic materials may include, but are not limited to, polyphenylene sulfide, polyamide, acetyl, acetylene-butadienestyrene terpolymer, polytetrafluoroethylene, polyvinyl chloride, polypropylene, polyethylene, polyethylene terephthalate (PET), polybutyline terephthalate (PBT), polycarbonate, or liquid crystal polymer (LCP). The surface metallization might be provided by electroless plating, evaporation, sputtering, metal paints, thermoformed metallized shielding, or the like. Metals for the shielding would include, but are not limited to, copper, nickel, silver, gold, aluminum, and the like.

The housing may be formed into any suitable shape, however, generally the housing defines an enclosure having an open end. The open end defines a base footprint having a predetermined width. The open end of the housing is positioned over the electronic components 40. The housing 11 may define discrete internal compartments such that individual electronic components may be individually shielded.

As illustrated in FIG. 1, the substrate 30 may comprise a printed wiring board (PWB). The PWB electrically connects the electronic components 40, which are mounted thereon, to form an appropriate electrical function. The electronic components are electrically connected to the PWB by the means of a series of electrical contact points 41. The electronic components are normally in the form of leadless packages, through hole packages, gull wing packages, J-lead packages, ball grid arrays, land grid arrays, or pin grid arrays, for example. The contact points 41 are attached to the PWB by means of sockets, solder, conductive adhesives, or any other suitable means.

As illustrated in FIG. 1, the electronic components 40 that need to be shielded against EMI/RFI will be surrounded by a ground strip or ring 31 that is formed as part of the top layer of the PWB 30. This ground ring will preferably be of a width equal to or greater than the width of the base footprint of the housing 11. The conductive surface of the ground ring may be formed by any conventional method used to manufacture PWBs. The conductive material to form the ring 31 may include, but is not limited to, etched copper or screen printed polymer thick films. It may also be desirable to plate a surface metal, such as nickel, gold, silver or the like, on the conductive surface to enhance resistance to environmental conditions while maintaining electrical conductivity. The ground ring 31 is preferably connected to a ground path of the electrical circuit of the PWB by the means of a circuit trace, plated through hole or the like.

The housing 11 is electrically and adhesively connected to the ground ring 31 on the PWB 30 by means of an electrically conductive adhesive 20. The spacing between the ground ring and any electrical contact 41 of a component 40 is such that there is no chance of electrically shorting an electrical contact 41 to either the housing 11 or the adhesive 20. Preferably, a suitable spacing is about 0.040 inches.

In a preferred embodiment of the present invention, the conductive adhesive material 20 comprises a substrate 21 which is provided with passageways 22 extending from one side of the substrate 21 to the other. The substrate can be a fabric, a porous membrane, a foam, or the like. Preferably it should be resilient and compressible to provide compliance when used as an adhesive substrate. The fabric can be a woven, nonwoven, knit or the like, provided it has the requisite passageways. Representative fabrics can be polyamide, PTFE, polyester, polyurethane or polyimide, or the like. An especially preferred substrate, for its strength, compressibility, temperature resistance and chemical inertness is porous polytetrafluoroethylene (PTFE).

As the term is used herein porous polytetrafluoroethylene (PTFE) shall mean a membrane which may be prepared by any number of known processes, for example, by stretching or drawing processes, by papermaking processes, by processes in which filler materials are incorporated with the PTFE resin and which are subsequently removed to leave a porous structure, or by powder sintering processes. Preferably, the porous polytetrafluoroethylene membrane is porous expanded polytetrafluoroethylene membrane having a microstructure of interconnected nodes and fibrils, as described in U.S. Pat. Nos. 3,953,566; 4,187,390; and 4,110,392, which are incorporated herein by reference, and which fully describe the preferred material and processes for making them.

The substrate 21 will generally have a thickness ranging from 0.003 inches to about 0.100 inches, and generally will take the form of a sheet, although the shape can be matched to the components that are being bonded together.

The walls of the passageways 22 have adhered to them a continuous conductive metal 23 which can be formed on the walls by an electroless plating procedure. Representative conductive metals include copper, nickel, silver, gold, and the like. The metal coating, or plating, does not fill the passageway volume but only covers the material defining the passageways.

When the substrate is a polymeric fabric such as a polyester fabric, such conductive plated substrates are available from Monsanto Co., under the tradename electron materials.

When the substrate is expanded porous PTFE, the conductive plated substrate can be prepared as described generally in U.S. Pat. No. 4,557,957.

Once the conductive metal material is in place on the walls of the passageways, the remaining passageway volume is filled with a nonconductive adhesive 24. Suitable adhesives include epoxy resin, acrylic resin, urethane resin, silicone resin, polyimide resin, cyanate ester resin, or the like. The adhesive is conveniently imbibed into the passageways by immersing the substrate in a solution of the adhesive. For an epoxy resin adhesive, a suitable solvent is methylethylketone.

The conductive housing 11 may be attached to the PWB 30 by placing the conductive adhesive 20 between the conductive housing 11 and the PWB 30, and applying pressure and/or heat to the conductive adhesive to connect the adhesive to both the footprint of the housing and a surface of the ground ring 31. A preferred adhesive would use a pressure sensitive adhesive resin that would require only minimal pressure and no additional heat. Depending on the performance needed, however, it might be preferable to use a thermoplastic, snap cure, or thermosetting adhesive resin to attach the conductive housing to the PWB.

In another embodiment of the present invention, the conductive housing 11 may be defined by a plastic material which has made integral therewith a continuous layer of the conductive adhesive 20. In this embodiment, the conductive adhesive 20 serves as both the metallization for the conductive housing to provide requisite EMI/RFI shielding and as the bonding mechanism for adhesively electrically mounting the conductive housing 11 to the ground strip 31.

EXAMPLE 1

A Faraday cage, in accordance with the teachings of the present invention, was made by first preparing a conductive housing by taking a 0.015 inch thick nickel sheet and using a standard draw down process to form a shield with a top, four sides, and an open bottom. Along the bottom edge of the housing, a flanged edge was formed that extended 0.04 inches from the edge of the sides. On a corresponding PWB, a 0.05 inch ground strip was etched in copper to match the footprint of the housing. A ring of conductive adhesive material was laser cut to produce a ring that was 0.04 inches wide and followed the footprint of the housing. The conductive adhesive was a metallized, porous ePTFE cadhesivee matrix filled with a polybutadiene adhesive resin. The conductive adhesive had a release liner on both sides to facilitate handling. The releaser liner was removed from one side of the laser cut conductive adhesive and the ring of adhesive was attached to the ground strip of the PWB using hand pressure. The other side of the release liner was removed, and the housing was placed on top of the adhesive with hand pressure. The housing measured an electrical resistance of 12 m $\Omega$ when measured with a four wire microohmmeter from the top of the housing to the edge of the ground strip.

EXAMPLE 2

A Faraday cage, in accordance with the teachings of the present invention, was made by first preparing a housing by taking a 0.015 inch thick nickel sheet and using a standard draw down process to form a shield with a top, four sides, and an open bottom. Along the bottom edge of the housing, a flanged edge was formed that extended 0.04 inches from the edge of the sides. On a corresponding PWB, a 0.05 inch ground strip was etched in copper to match the footprint of the housing. A ring of conductive adhesive was laser cut to produce a ring that was 0.04 inches wide and followed the footprint of the housing. The conductive adhesive was a metallized, porous polyester conductive matrix filled with a polybutadiene adhesive resin. The conductive adhesive had a release liner on both sides to facilitate handling. The release liner was removed from one side of the laser cut adhesive and the ring of adhesive was attached to the ground strip of the PWB using hand pressure. The other side of the release liner was removed, and the housing was placed on top of the adhesive with hand pressure. The housing measured an electrical resistance of 143 m$\Omega$ when measured with a four wire microohmmeter from the top of the housing to the edge of the ground strip.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

We claim:

1. A Faraday cage comprising:
   a circuit board having an electrical ground;
   at least one electronic component electrically connected to the circuit board;
   a conductive housing having at least an open end; and
   an electrically conductive adhesive having a substrate having numerous passageways through the substrate defined by a plurality of internal surfaces, said internal surfaces defining said passageways having disposed thereon a layer of conductive metal, said passageways being at least partially filled with an adhesive resin, wherein the electrically conductive adhesive electrically mounts the conductive housing to the electrical ground of the circuit board, such that the open end of the conductive housing is disposed over the at least one electronic component, to shield electromagnetic and radio frequency interference.

2. The invention of claim 1, wherein the conductive housing is a metallized plastic housing.

3. A Faraday cage comprising:
   a printed wiring board having an electrical ground;
   at least one electronic component electrically connected to the printed wiring board;
   a conductive housing; and
   an electrically conductive adhesive having a substrate having numerous passageways through the substrate, the passageways being defined by a plurality of walls, said walls being covered with a layer of conductive metal, said passageways being at least partially filled with a non-conductive adhesive resin;
   wherein the electrically conductive adhesive mounts the conductive housing to the electrical ground of the printed wiring board, over the at least one electronic component, to shield electromagnetic and radio frequency interference.

4. An article comprising:
   a conductive housing having at least one open end; and
   an electrically conductive adhesive disposed on a surface of the conductive housing about the open end, said electrically conductive adhesive having a substrate having numerous passageways through the substrate, the passageways being defined by a plurality of walls, said walls having disposed thereon a layer of conductive metal, said passageways being at least partially filled with a non-conductive adhesive resin;
   wherein said conductive housing is conformably dimensioned to receive an electronic component through said open end.

* * * * *